(12) United States Patent
Ejiri (10) Patent No.: US 6,278,143 B1
(45) Date of Patent: *Aug. 21, 2001

(54) SEMICONDUCTOR DEVICE WITH BIPOLAR AND J-FET TRANSISTORS

(75) Inventor: Hirokazu Ejiri, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/145,431

(22) Filed: Sep. 1, 1998

(30) Foreign Application Priority Data

Sep. 2, 1997 (JP) .................................................. 9-237110

(51) Int. Cl.[7] ............................ H01L 29/41; H01L 29/73; H01L 29/808
(52) U.S. Cl. ............................................ 257/273; 257/262
(58) Field of Search .................................... 257/273, 262, 257/350

(56) References Cited

U.S. PATENT DOCUMENTS

| | | | | |
|---|---|---|---|---|
| 4,485,392 | * | 11/1984 | Singer | 257/272 |
| 4,600,932 | * | 7/1986 | Norris | 257/272 |
| 4,901,132 | * | 2/1990 | Kuwano | 257/273 |
| 5,254,864 | * | 10/1993 | Ogawa | 257/273 |
| 5,488,241 | * | 1/1996 | Journeau | 257/273 |
| 5,659,190 | * | 8/1997 | Litwin | 257/273 |

* cited by examiner

Primary Examiner—Jerome Jackson, Jr.
(74) Attorney, Agent, or Firm—Sonnenschein, Nath & Rosenthal (57) ABSTRACT

In a semiconductor device by a complex-type bipolar transistor device in which a junction-type field effect transistor is connected to a bipolar transistor, to make it possible to ensure a good and stable characteristic of the bipolar transistor without incurring a larger area in the junction-type field effect transistor J-FET.

In a semiconductor device having a bipolar transistor (TR) and a junction-type field effect transistor (J-FET), in which a collector of the bipolar transistor and a source of the junction-type field effect transistor are connected, a gate region (14) of the junction-type field effect transistor, a gate contact conductive layer 17G, and a drain contact conductive layer 18D for a drain region are formed of conductive layers which are formed as respectively different layers with a same conductive material or mutually different materials and an arrangement surface of an edge portion 17G₁ on the drain side of the gate contact conductive layer is positioned below an arrangement surface of an edge portion 18D₁ on the gate side of the drain contact conductive layer.

13 Claims, 7 Drawing Sheets

SEMICONDUCTOR DEVICE WITH BIPOLAR AND J-FET TRANSISTORS

BACKGROUND

1. Field of the Invention

The present invention relates to a semiconductor device and particularly, to a complex-type bipolar transistor device comprising a bipolar transistor and a junction-type field effect transistor and its manufacturing method.

2. Background of the Invention

Figure 1:
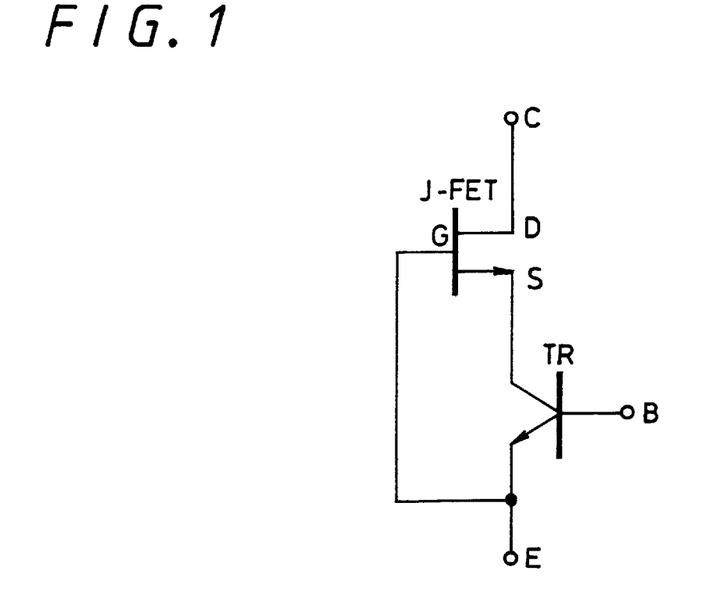
FIG. 1 is a circuit diagram of another example of the semiconductor device according to the present invention.

As shown in FIG. 1, a fact that a complex structure high breakdown bipolar transistor is constituted by cascode-connecting a high breakdown voltage junction-type field effect transistor J-FET to a bipolar transistor TR is disclosed, for example, in Japanese laid-open patent publication No. 53-67368.

According to this structure, when a high voltage is applied to a collector side terminal C of the bipolar transistor TR, a depletion layer spreads from a gate junction of the junction-type field effect transistor J-FET giving rise to a pinch-off and as a result, it is interrupted that a high voltage is applied to a collector region of the bipolar transistor TR. That is, as for a collector to emitter voltage Vce of the bipolar transistor TR, only a voltage less than a pinch-off voltage Vp of the junction-type field effect transistor J-FET is applied, thereby making it possible to implement high breakdown voltage in a low withstand voltage bipolar transistor.

In the case of this structure, however, a maximum handling electric current in the bipolar transistor TR is limited to less than a saturation current I dss of the junction-type field effect transistor J-FET. Consequently, when it is tried to increase the saturation current I dss of the junction-type field effect transistor J-FET, there arises a need to make its gate width (channel width) larger, thereby giving rise to an inconvenience that an area occupied by the junction-type field effect transistor J-FET becomes larger.

On the other hand, a complex-type high breakdown voltage bipolar transistor capable of handling at least a large electric current below the saturation current I dss of the junction-type field effect transistor J-FET is proposed by, for example, Japanese laid-open patent publication No. 54-89581.

Figure 2:
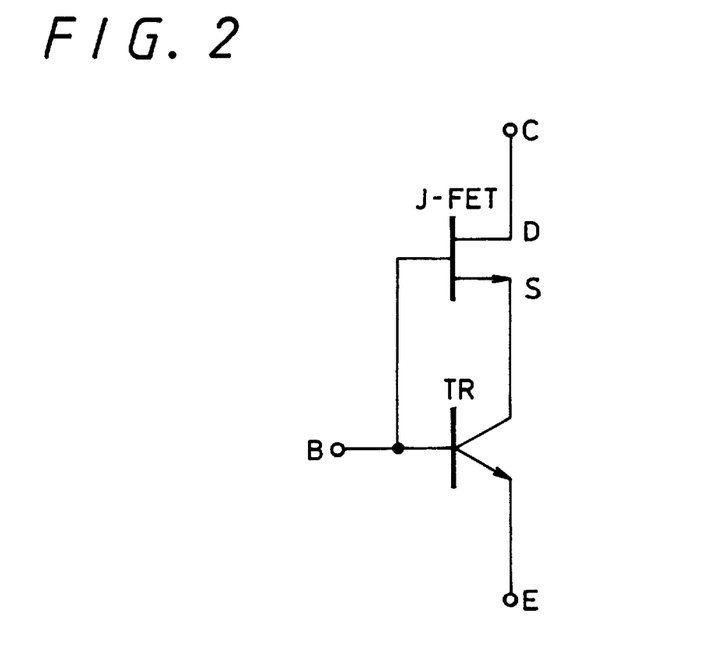
FIG. 2 is another circuit diagram of the semiconductor device according to the present invention.

According to this proposal, for example, as shown in FIG. 2, a collector of an npn type bipolar transistor TR is connected to a source of a junction-type field effect transistor J-FET and at the same time, a base of the bipolar transistor TR is connected to a gate G of the J-FET. In this case, when a high voltage is applied to the collector side terminal C, the junction-type field effect transistor J-FET is put into the pinch-off so that only a voltage less than a pinch-off voltage vp of the J-FET is applied to the bipolar transistor TR, with the result that the high breakdown voltage is implemented in the low operating bipolar transistor TR. In this case, when the bipolar transistor TR is in a state of saturation, the gate of the J-FET is biased in a forward direction, thereby making it possible to handle a large electric current exceeding the saturation electric I dss current of the J-FET.

In these structures, in order to implement the high breakdown voltage of the low operating voltage transistor in the bipolar transistor TR, it is necessary to reduce the pinch-off voltage Vp in the junction-type field effect transistor J-FET.

Also, in the case of these structures, as the part between the source and the drain of junction-type field effect transistor FET is serially connected to the collector of the bipolar transistor TR, there is a demand that the ON resistance of the J-FET is selected as low as possible in order to obtain a high speed responsiveness and a-high frequency characteristic.

However, in order to implement the reduction of the ON resistance in the J-FET and the improvement of the saturation current Idss in the J-FET, it is necessary to increase the impurity concentration in a channel portion. When the concentration in the channel portion is increased, it entails an increase in the pinch-off voltage Vp, thereby making the reduction of the pinch-off voltage Vp incompatible with the reduction of the ON resistance and the improvement of the Idss. Also, in order to increase the Idss and implement the reduction of the ON resistance without increasing the pinch-off voltage Vp, it is conceivable that a gate width is made larger, but in this case, the area occupied by the J-FET increases, thereby impeding high density of a device and implementation of a lesser area.

SUMMARY OF THE INVENTION

The present invention is, as mentioned above, in a semiconductor device by a complex-type bipolar transistor device wherein a junction-type field effect transistor is connected to a bipolar transistor, to provide a semiconductor device and its manufacturing method which makes it possible to ensure a good and stable characteristic of the bipolar transistor without incurring an area to become larger in the junction-type field effect transistor J-FET.

The present invention is arranged, in a semiconductor device comprising a bipolar transistor and a junction-type field effect transistor, in which a collector of the bipolar transistor and a source of the junction-type field effect transistor are connected, such that a gate contact conductive layer which is put in ohmic-contact with a gate region of the junction-type field effect transistor and a drain contact conducive layer which is put in contact with a drain region are formed of conductive layers which are formed of conductive layers as respectively different layers made of a same conductive material or mutually different conductive materials, and an arrangement surface at an edge portion on a drain side of the gate contact conductive layer is formed by being positioned below an arrangement surface at an edge portion on a gate side of the drain contact conductive layer.

Also, the present invention is, in a method for manufacturing a semiconductor device comprising a bipolar transistor and a junction-type field effect transistor, in which the collector of the bipolar transistor and the source of the junction-type field effect transistor are connected, to obtain a target semiconductor device in a way that by carrying out a process for forming a gate contact conductive layer in the junction-type field effect transistor, a process for forming an inter-layer insulating layer on the gate contact conductive layer and thereafter, a process for forming a drain contact conductive layer which forms the drain contact conductive layer of the junction-type field effect transistor, the arrangement surface at the edge portion on the drain side of the gate contact conductive layer is so formed as to be positioned above the arrangement surface at the edge portion on the gate side of the drain contact conductive layer.

In the meantime, the arrangement surface at the edge portion of the contact conductive layer in this specification is, in a case where the contact conductive layer is of a multi-layer structure, for example, lamination-layer structured by a contact conductive layer consisting of a semiconductor layer, a contact conductive layer consisting of a metal layer and the like, to indicate the arrangement surface at the edge portion of the conductive layer in a low layer.

Meanwhile, according to the above-mentioned arrangement of the present invention, as the arrangement surface at the edge portion on the drain side of the gate contact conductive layer in the junction-type field effect transistor is made to be a different surface from the arrangement surface at the edge portion on the gate side of the drain contact conductive layer, both the conductive layers can be arranged to be close enough or overlapping one another, while retaining the areas of both the conductive layers in a necessary and sufficient state and further, because the gate portion and the drain electrode contact portion can resultantly be arranged adequately close, high density, reduction of the ON resistance as well as improvement of Idss are implemented.

Also, the arrangement surface at the edge portion on the drain side of the gate contact conductive layer is made to be different from the arrangement surface at the edge portion on the gate side of the drain contact conductive layer as well as to be the arrangement surface below it, so the gate contact conductive layer can be extended over the drain region through an insulating layer and as a result, because a so-called MIS-FET structure is formed in the extended portion, a field effect due to this implements reduction in the pinch-off voltage Vp. Therefore, as an enormous decrease in the impurity concentration in the channel portion can be avoided in order to reduce the pinch-off voltage Vp, such inconveniences that the ON resistance becomes high and the Idss drops can be avoided, thereby making it possible to reduce the pinch-off voltage Vp and further, to implement the reduction in the ON resistance, the improvement of the Idss as well as to manufacture the bipolar transistor which has a stable and excellent characteristic.

Also, in order to manufacture this semiconductor device, according to the method of the present invention, an increase in process Idss is never incurred and hence, a drop in productivity and an increase in costs are not brought about.

DESCRIPTION OF THE PREFERRED EMBODIMENTS

Embodiments of a device according to the present invention and its manufacturing method according to the present invention will be described.

In the present invention, as explained in FIG. 1 or FIG. 2, there is formed such a structure on a common semiconductor that a collector of a conductivity bipolar transistor TR, for example, an n-type collector of an npn-type and a source of a conductivity junction-type field effect transistor J-FET, for example, an n-type source are connected each other. Then, as shown in FIG. 1, an emitter of the bipolar transistor TR and a gate of the junction-type field effect transistor J-FET are connected, or as shown in FIG. 2, a base of the bipolar transistor TR and the gate of the junction-type field effect transistor J-FET are connected.

In this structure, a gate contact conductive layer relative to a gate region of the J-FET and a drain contact conductive layer relative to a drain region are formed of conductive layers which are formed as different layers made of a same conductive material or mutually different conductive materials.

Then, an edge portion on the drain side of the gate contact conductive layer is formed on the drain region through an insulating layer and its arrangement surface is positioned below an arrangement surface at an edge portion on the gate side of the drain contact conductive layer.

The edge portion on the drain side of the gate contact conductive layer is extended over the drain region of the above-mentioned junction-type field effect transistor through the insulating layer.

Also, the gate contact conductive layer and a base contact conductive layer are formed by patterning a same conductive layer.

Then, in the above-mentioned arrangement, the edge portion on the drain side of the drain contact conductive layer is formed on the drain region through the insulating layer, and because its arrangement surface is formed below the arrangement surface of the edge portion on the gate side of the drain contact conductive layer, it is possible to form both the conductive layers in a small area compared with a case where they are formed on a same arrangement surface.

Also, according to a method for manufacturing a semiconductor device of the present invention, at a time of manufacturing the above-mentioned device of the present invention, the gate contact conductive layer of the gate region of its J-FET is formed on the drain region through the insulating layer, and after the formation of the gate contact conductive layer, an inter-layer insulating layer on the gate contact conductive layer is formed, and then, a contact conductive layer for the drain region is formed, whereby the above-mentioned target semiconductor device of the present invention is obtained.

With reference to FIG. 3 through FIG. 6, a case for obtaining one example of the semiconductor device according to the present invention by one example of the manufacturing method of the present invention will be explained. In this example, there is manufactured such a device that at least an npn type bipolar transistor TR and an n-channel junction-type field effect transistor J-FET are formed on a same semiconductor substrate, and an n type collector of the bipolar transistor TR and an n type source of the n-channel junction-type field effect transistor J-FET are connected. In this case, though not shown, the semiconductor device having a circuit arrangement in FIG. 1 or FIG. 2, in which the gate of the junction-type field effect transistor and the emitter or base of the bipolar transistor TR are electrically connected is formed.

Figure 3A:
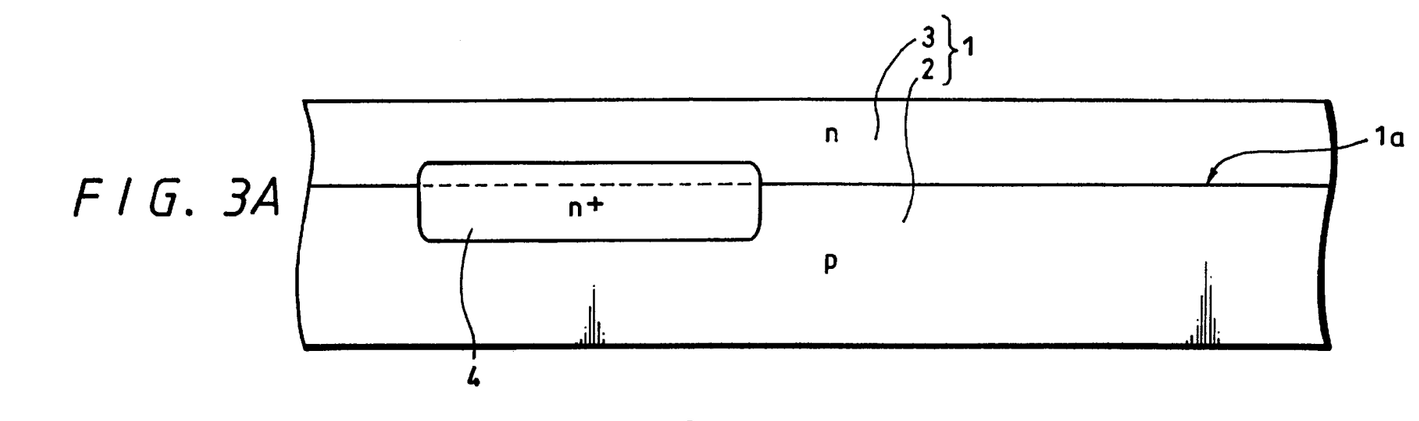
FIGS. 3A and 3B are schematic cross-sectional views in processes of an example of the manufacturing method according to the present invention, respectively.

In this example, as shown in FIG. 3A, a semiconducting substrate 2 made of, for example, a p-type single crystal Si substrate is prepared, and on its one major surface 1a, a semiconductor layer 3, for example, an n-type semiconducting layer with resistivity of 0.3~5.0 Ω·cm, and thickness of about 0.5~2.5 μm is epitaxially grown to thereby form a semiconductor substrate 1.

Prior to the epitaxial growth of this semiconductor layer 3, into a portion on the major surface 1a of the semiconductor base body 2 where the transistor TR is finally formed, an n-type impurity is selectively introduced by way of an ion-implantation method, a diffusion method and the like in high concentration to form a collector burying region 4 with a high impurity concentration, and thereafter, the epitaxial growth of the semiconductor layer 3 is carried out. At this time, due to heating at the time of the epitaxial growth of the semi-conductor layer 3, a part of the impurity introduced to the semiconductor substrate body 2 is diffused into the semiconductor 3 and the collector burying region 4 is formed stretching out from the semiconductor substrate 2 to the semiconductor layer 3.

Figure 3B:
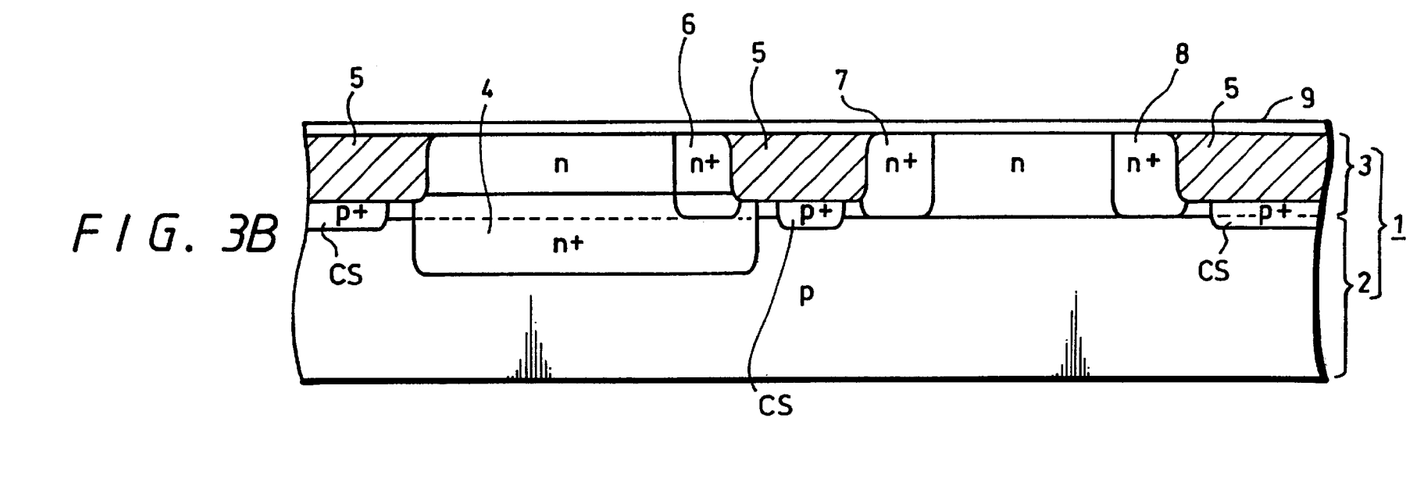

As shown in FIG. 3B, in a portion between forming portions of respective semiconductor elements, that is, in this example, between forming portions of the bipolar transistor TR and the junction-type field effect transistor J-FET, and between forming portions of other circuit elements, an element separation insulating layer 5 is formed in a grid shape by way of the well known LOCOS (Local Oxidation of Silicon).

Also, at a forming portion of the bipolar transistor TR, a collector electrode take-out region 6 reaching as deep as, for example, the collector burying region 4 and at both opposing outside portions of the forming portion of the junction-type field effect transistor J-FET, a source high concentration region 7 and a drain high concentration region 8 are respectively formed by respectively introducing the n-type impurity in high concentration. The formation of these regions 6, 7 and 8 can be formed by ion-implanting, for example, P (phosphor) ion with a dosage of $1\times10^{15}/cm^2$~$1\times10^{16}/cm^2$ at 50~100 keV.

Then, a surface of the semiconductor substrate 1 is flattened by coating, for example, a photoresist and etchingback and a p-type channel stop region CS is formed beneath the element separation insulating layer 5 by the ion-implantation.

On the surface of the semiconductor substrate 1, for example, a film of $SiO_2$ with a thickness of 50~200 nm is formed by way of a CVD (Chemical Vapor Deposition) method or the like to form an insulating layer 9.

Figure 4A:
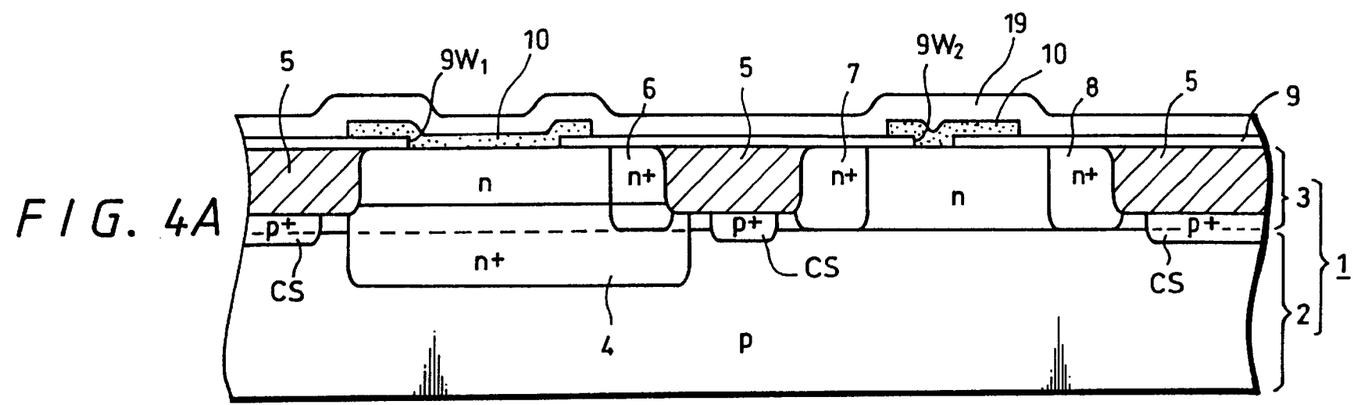
FIGS. 4A and 4B are schematic cross-sectional views in processes of an example of the manufacturing method according to the present invention, respectively.

As shown in FIG. 4A, through the insulation layer 9 formed by the process shown in FIG. 1B, impurity introduction windows $9w_1$ and $9w_2$ are respectively bored at its portion under which a base region forming portion is finally formed in the bipolar transistor TR forming portion and its a portion under which formed a gate region forming portion of the junction-type field effect transistor J-FET.

Thereafter, first of all, in contact with a surface all over of the semiconductor layer 3, a first polycrystal semiconductor layer 10, for example, a Si polycrystal semiconductor layer is formed with the thickness of 80~250 nm by the CVD method and the like through the impurity introduction windows $9w_1$ and $9w_2$. This semiconductor layer 10 is formed either as a layer containing the p-type impurity in high concentration when its film is formed, or, a layer containing the p-type impurity in high concentration by ion-implanting, for example, boron $B^+$ or $BF_2^+$ after the film of the semiconductor layer is formed.

Thereafter, this polycrystal semiconductor layer 10 is subjected to the pattern-etching by way of photolithography, and then it is patterned to a pattern corresponding to a contour of the base contact conductive layer of the bipolar transistor to be finally obtained and a pattern corresponding to a contour of a gate contact conductive layer of the junction-type field effect transistor J-FET to be finally obtained. Then, covering the first polycrystal semiconductor layer 10 containing the impurity, $SiO_2$, for example, is formed by the CVD method as a film with the thickness of about 200~500 nm to form an inter-layer insulating layer 19 all over the surface. At this time, depending on a necessity, growth of a crystal grain of Si in the polycrystal semiconductor layer 10 is accelerated by carrying out heat treatment, thereby making it possible to implement its low resistance and uniformity.

Figure 4B:
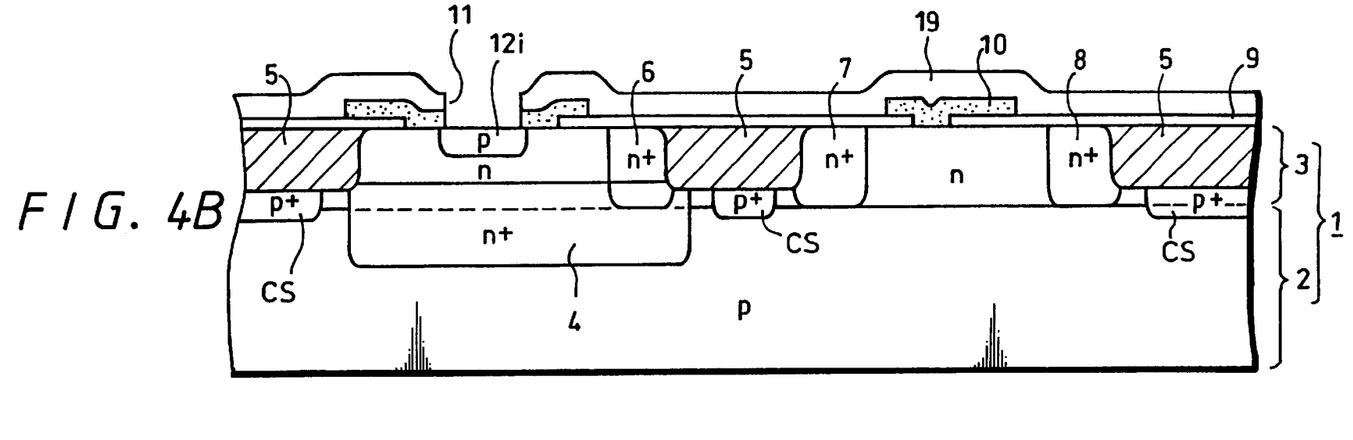

As shown in FIG. 4B, an impurity introducing window 11 is formed through the inter-layer insulating layer 19 and the first polycrystal semiconductor layer 10 above a forming portion of an intrinsic base region of the bipolar transistor by way of the pattern-etching and the like by the photolithography and through this window 11, a p-type impurity is introduced to form an intrinsic base region 12. The formation of the intrinsic base region 12 by introducing the impurity can be carried out by ion-implanting, for example, $BF_2^+$ at 5 keV~200 keV with a dosage of $5.0\times10^{11}$~$5.0\times10^{14}/cm^2$, or by ion-implanting $B^+$ at 5 keV~100 keV with a dosage of $5.0\times10^{11}$$5.0\times10^{14}/cm^2$.

Also, introduction of the impurity can be carried out by the vapor-phase diffusion.

Also, depending on a necessity, formation of an SIC (Selective Implanted Collector) (not shown) can be formed by, for example, ion-implanting an n-type impurity ion, for example, $P^+$ at 50 keV~400 keV with a dose amount of $5.0\times10^{11}/cm^2$~$1.0\times10^{13}/cm^2$.

Figure 5:
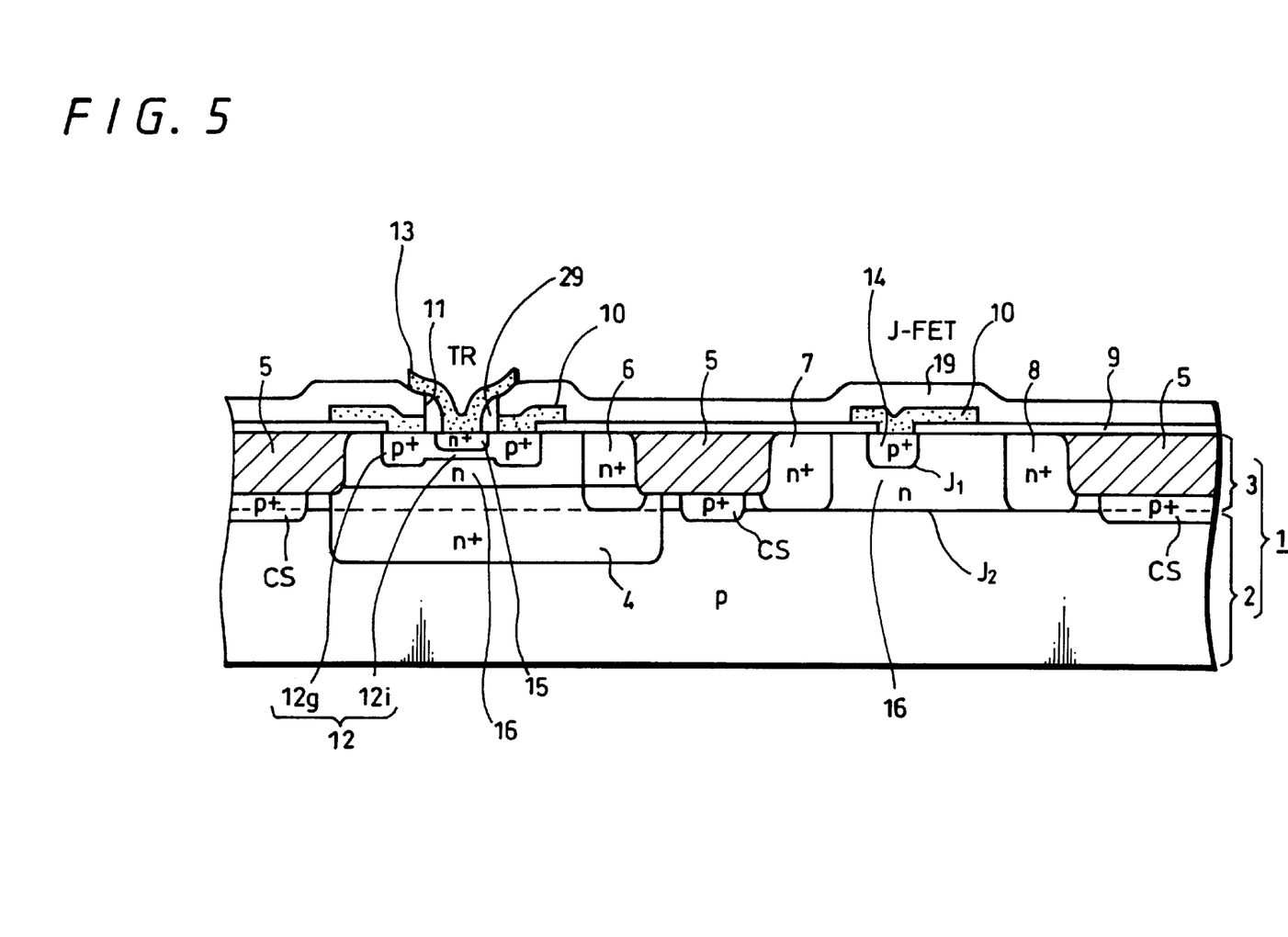
FIG. 5 is a schematic-cross-sectional view in one process of one example of the manufacturing method according to the present invention.

Nextly, as shown in FIG. 5, a side wall 29 is formed on an inside surface of the impurity introducing window 11. The formation of the side wall 29 can be formed by carrying out a well known method, for example, the CVD method and the like in which $SiO_2$ is deposited to a thickness of about 400~1 μm, and by carrying out an anisotropic etching presenting high etching property in a horizontal direction by a RIE (reactive ion etching) on the whole surface thereof.

Then, a second polycrystal semiconductor 13 by, for example, polycrystal Si, which contains an n-type impurity is formed the whole surface including an inside of the window 11 where the side wall 29 is formed. This semiconductor layer 13 can be formed into a film as a semiconductor layer containing the n-type impurity such as, for example, As and P (phosphorous) when it is formed into the film, or after the polycrystal semiconductor layer 13 is formed into the film, it can be made a polycrystal semiconductor layer containing the impurity by ion-implanting thereinto the n-type impurity, for example, As, P (phosphorous) and the like.

Thereafter, the second polycrystal semiconductor layer 13 is patterned into a pattern of an emitter contact conductive layer by carrying out a pattern etching by, for example, the photo-lithography.

Nextly, for example, a $SiO_2$ film (not shown in the figure) is deposited on the whole surface with the thickness of 100 nm~500 nm by the CVD method, and heat treatment of about 700° C.~1200° C. is carried out thereto for 5 seconds~2 hours to diffuse the p-type impurity from the first polycrystal semiconductor layer 10 to the semiconductor layer 3, whereby in the forming portion of the bipolar transistor TR, a p-type graft base region $12_g$ with high impurity concentration is formed surrounding on the periphery of the previously formed intrinsic base region 12$i$, and hence, the base region 12 is formed of these, as well as in the forming portion of the junction-type field effect transistor J-FET, a gate region 14 is formed. Also, at the same time, the n-type impurity is diffused from the second polycrystal semiconductor layer 13 to form an emitter region 15 having a high impurity concentration.

In this manner, for example, a part of the n-type semiconductor layer 3 on the collector burying region 4 serves as a collector region 16, the p-type base region 12 is formed thereon, and the n-type emitter region 15 is formed on the base region so that the bipolar transistor TR is formed, while the junction-type field effect transistor J-FET is formed on the same semiconductor substrate 1 in which a channel portion 16 is formed between a gate junction $j_1$ under the gate region 14 and a p-n junction portion $j_2$ between the p-type semiconductor base body 2 and the n-type semiconductor layer 3, and both sides of the channel portion serve as a source region as well as a drain region, where the source high concentration region 7 and the drain high concentration region 8 are respectively formed.

Figure 6:
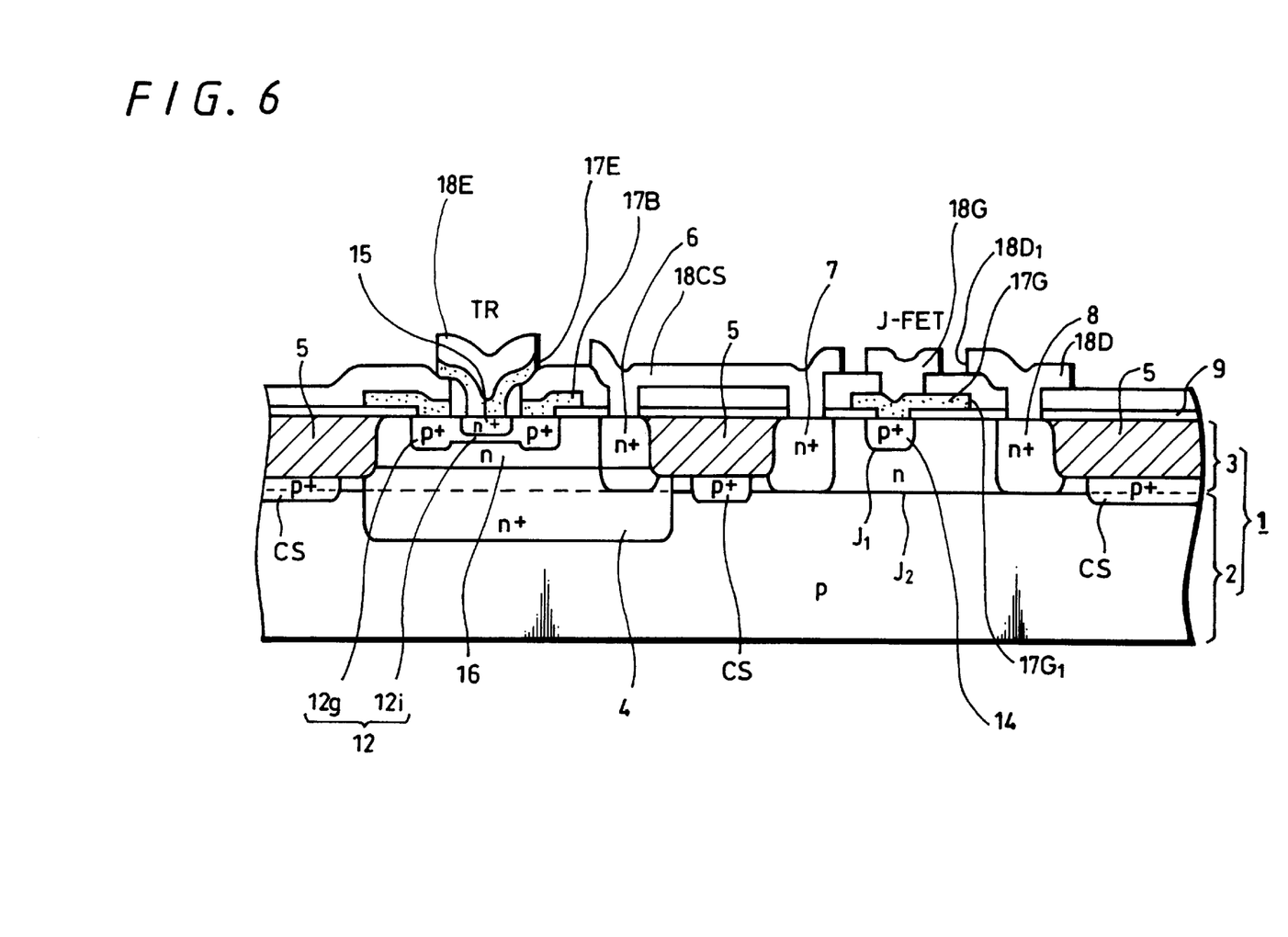
FIG. 6 is a schematic cross-sectional view in one process of one example of the manufacturing method according to the present invention.

Then, as shown in FIG. 6, through the respective insulating layers 9, 19 and the like, on the collector electrode take-out region 6, on the source high concentration region 7, on the drain high concentration region 8, on a gate contact conductive layer 17G and further, as mentioned above, in a case when the insulating layer is formed all over the surface, even on an emitter contact conductive layer 17E, contact windows are respectively bored and a conductive layer with good conductivity, which comes wholly in ohmic contact with respective regions including insides of these windows is formed. This conductive layer can be formed by making a Ti/TiON/Al structure in which a metal conductive layer such as aluminum and the like through, for example, a Ti layer and a TiON layer as a barrier metal layer is wholly deposited by way of evaporation, sputtering and the like. Then, pattern-etching by the photolithography is carried out for this metal conductive layer. In this example, a contact conductive layer 18CS which extends over the collector electrode take-out region 6 and the source high concentration region 7 and electrically connects the both is formed and at the same time a drain contact conductive layer 18D is formed on the drain high concentration region 8, and upper layer contact conductive layers 18G and 18E respectively having good conductivity are respectively formed on a gate contact conductive layer 17G and an emitter contact conductive layer 17E for the gate and the emitter.

In this manner, such a semiconductor device is formed in which the bipolar transistor TR and the junction-type field effect transistor J-FET are formed on the same semiconductor substrate 1, and on the graft base region 12$g$ of the base region 12 of the bipolar transistor TR and on the gate region 14 of the junction-type field effect J-FET, the same conductive layer, that is, a base contact conductive layer 17B and the gate contact conductive layer 17G made of the first polycrystal semiconductor layer 10 are put into contact with each other by the so-called self-alignment, and in the emitter region 15, the emitter contact conductive layer 17E by the second polycrystal semiconductor 13 is so constituted as to be put in contact by self-alignment.

Then, though not shown in the figure, there is provided a semiconductor device having a circuit arrangement explained in FIG. 1, in which, for example, the upper layer contact conductive layer 18E of the emitter and the upper layer contact conductive layer 18G of the gate are electrically connected with each other by a method to form the same in a continuous pattern or the like.

Or, in the above-mentioned arrangement, there is provided a semiconductor device having a circuit arrangement explained in FIG. 2 in which, for example, the gate region 14 of the junction-type field effect transistor J-FET and the base region 12 of the bipolar transistor TR, for example, the graft base region 12$g$ are simultaneously formed into a continuous pattern though not shown.

That is, the gate of the n channel-type junction-type field effect transistor J-FET and the emitter or the base of the npn-type bipolar transistor TR are connected and the source of the J-FET and the collector of the TR are connected to constitute a semiconductor device wherein a transistor is made to have a high breakdown voltage.

Then, in the semiconductor device according to the present invention, because the gate contact conductive layer 17G thereof and the drain contact conductive layer 18D are respectively formed as the conductive layers made by different processes, that is, formed as layers different from each other, an arrangement surface of an edge portion $17G_1$ on the drain side of the gate contact conductive layer 17G and an arrangement surface of an edge portion $18D_1$ on the gate side of the drain contact conductive layer 18D are made different arrangement surfaces in a thickness direction and by doing so, the gate contact conductive layer 17G and the drain contact conductive layer 18D are laminated or closed to each other through the inter-layer insulating layer 19.

Also, in the semiconductor device according to the present invention, as the gate contact conductive layer 17G and the drain contact conductive layer 18D are formed as different layers, the gate contact conductive layer 17G is located below the arrangement surface of the edge portion $18D_1$ on the side of the drain contact conductive layer 18D, that is, the gate contact conductive layer 17G is extended from the gate region 14 to the drain side through the insulating layer 9, thereby forming a MIS (in this case, MOS) structure portion here.

Since the device according to the present invention shown in FIG. 6 is, as mentioned above, made to have the circuit configuration, for example, shown in FIGS. 1 or 2, as described in the beginning, high breakdown voltage of the bipolar transistor TR can be implemented, and since the arrangement surface of the edge portion $17G_1$ on the drain side of the gate contact conductive layer 17G and the arrangement surface of the edge portion $18D_1$ on the gate side of the drain contact conductive layer 18D are made to be different surfaces in the junction-type field effect transistor J-FET, it is possible to arrange both the arrangement surfaces in a way that they are close enough each other or they overlap each other while retaining areas of both the conductive layers in a necessary and sufficient state and further, the gate portion and the contact portion of the drain electrode can be located in enough proximity, as the result, high density as well as reduction of an On resistance and improvement of an I dss can be implemented.

Also, because the edge portion $17G_1$ on the drain side of the gate contact conductive layer 17G is protruded to the drain side to present the MIS or MOS structure, a depletion layer to be formed when a reverse bias is applied to the gate is formed due to actions by both of the junction $J_1$ of the gate region 14 and a MIS-FET or a MOS-FET effect, thereby making it possible to realize more lowering of the pinch-off voltage Vp of J-FET or reduction in the leak current.

Also, as mentioned above, by forming the edge portion 17G1 on the drain side of the gate contact conductive layer 17G and the drain contact conductive layer 18D as different layers, a distance between the edge portions of the both in the plate surface direction can be made nearer than a minimum distance (clearance) limited by the photo-lithography and the etching in a case of being formed of the same layer. Therefore, in a case when the gate upper layer contact conductive 18G and the drain contact conductive layer 18D as the gate electrode and the drain electrode are, as in the above-mentioned example, formed of the same conductive layer, for example, the metal layer of the Ti/TiON/Al structure, the above-mentioned MIS or MOS structure portion can sufficiently be protruded (extended) to the drain side, thereby capable of enhancing the above-mentioned MOS or MIS FER effect.

Then, because the reduction in the pinch-off voltage Vp can be implemented in this manner, the conspicuous lowering of the impurity concentration in the channel portion can be avoided, so that such an inconvenience that the On resistance is increased and the Idss is lowered can be avoided, whereby the pinch-off voltage Vp can be lowered, the On-resistance is lowered and Idss is improved, thereby making it possible to manufacture a bipolar transistor which has a stable and excellent characteristic.

Also, in the above-mentioned manufacturing method according to the present invention, there is employed a manufacturing method for a two-layer polycrystal layer-type bipolar transistor capable of self-matching (self-alignment) the contact conductive layer and the respective regions by using the first and second polycrystal semiconductor layers 10 and 13, by introducing therefrom the impurity to the semiconductor substrate to form the graft base region and the emitter region as well as by making these semiconductor layers the electrode take-out contact conductive layer from the graft base region and the emitter region. According to the present invention, it is possible to constitute the semiconductor device wherein the junction-type field effect transistor J-FET and the bipolar transistor TR are formed by a simple method without increasing the number of process compared with the manufacturing method for the two-layer polycrystal layer type bipolar transistor of this kind in an ordinary bipolar integrated circuit.

Figure 7:
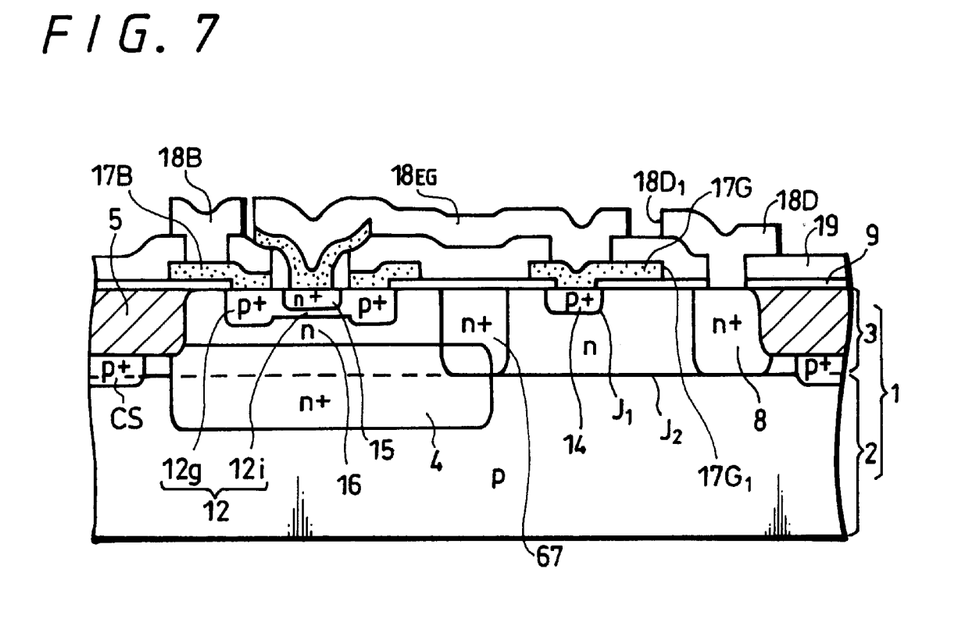
FIG. 7 is a schematic cross-sectional view of another example of the semiconductor device according to the present invention.
Figure 8:
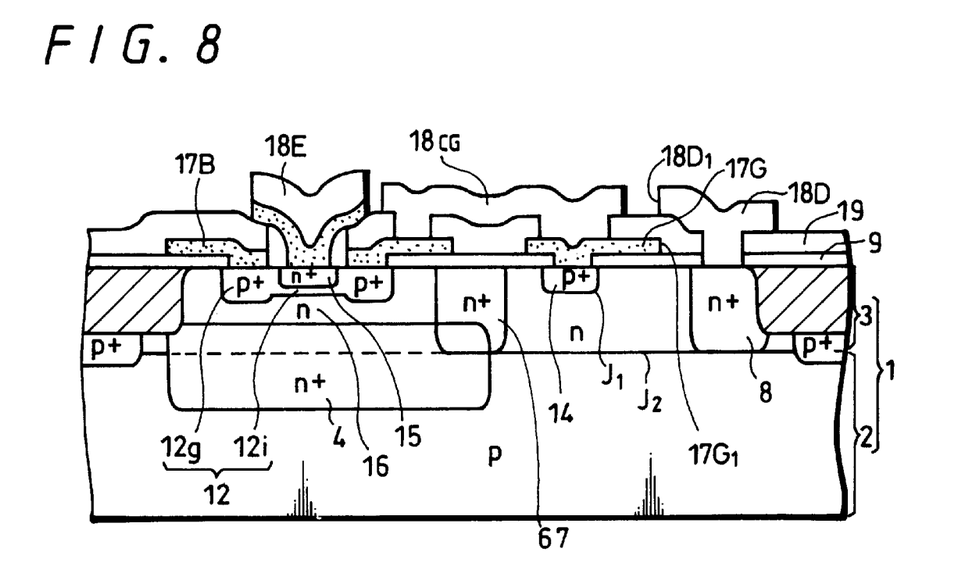
FIG. 8 is a is a schematic cross-sectional view of a further example of the semiconductor device according to the present invention.
Figure 9:
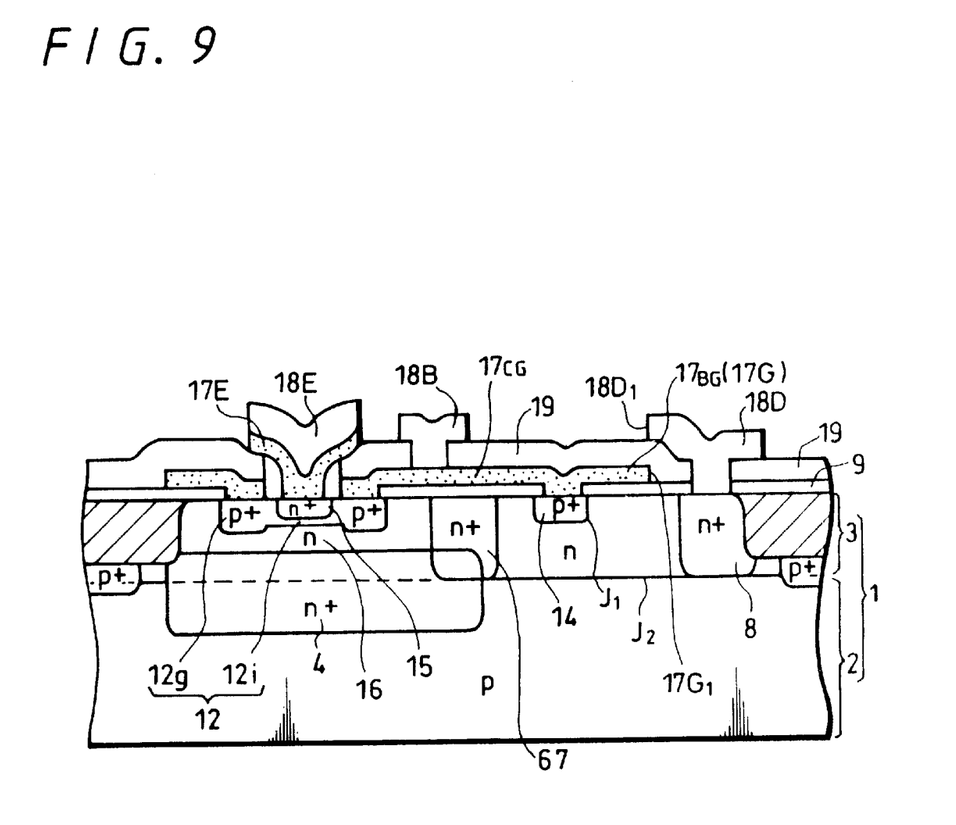
FIG. 9 is a schematic cross-sectional view of another example of the semiconductor device according to the present invention.

Meanwhile, the above-mentioned example is the case where the collector electrode take-out region 6 of the bipolar transistor TR and the source high concentration region 7 of the junction-type field effect transistor J-FET are respectively formed, but as shown in FIGS. 7 to 9, both the regions 6 and 7 can be formed as a common region 67.

In FIGS. 7 to 9, the parts corresponding to those in FIGS. 3 to 6 are marked with the same references and repeated descriptions of the structure and the manufacturing method explained in connection with FIGS. 3 to 6 will be omitted. However, an example of FIG. 7 showing its schematic cross-section view, it is a case of structure having the circuit arrangement explained in FIG. 1 by providing an arrangement wherein the emitter upper layer contact conductive layer 18E and the gate upper layer contact conductive layer 1G in FIG. 4 are connected by a common contact conductive layer 18EG. Also, in this case, a contact window is bored through a part of the insulating layer 19 on the base contact conductive layer 17B, and through the contact window, the base upper contact conductive layer 18B is formed to be used to draw out a base terminal.

Then, in this case, the contact conductive layers 18B and 18EG can respectively be formed simultaneously with the formation of the drain contact conductive layer, that is, as mentioned above, by the pattern etching of metal layers of, for example, the Ti/TiON/Al structure.

Also, in an example shown in FIG. 8, it is a case of forming a semiconductor device having the circuit arrangement shown in FIG. 2 wherein the base-of the bipolar transistor TR is connected to the gate of the junction-type field effect transistor J-FET, by such a manner that, same as mentioned above, for example, together the formation of the drain contact conductive layer 18D with the Ti/TiON/Al structure, a contact conductive layer 18CG which comes in ohmic contact with the base contact conductive layer 17B and the gate contact conductive layer 17G each of which is formed of the first polycrystal semiconductor 10 is, in the same manner mentioned above, formed simultaneously with, for example, the formation of the drain contact conductive layer 18D.

Also, an example shown in FIG. 9 is a case of forming a semiconductor device having the circuit arrangement shown in FIG. 2, wherein the base contact conductive layer 17B and the gate contact conductive layer 17G, which are formed of the first polycrystal semiconductor 10 as explained in connection with FIGS. 3 to 6, are formed in a continuous pattern as a common contact conductive layer 17BG by the first polycrystal semiconductor layer 10.

Then, the semiconductor device and its manufacturing method in each of examples shown in FIGS. 7 to 9, make it possible that in the same manner as explained in FIG. 3 to 6, due to the arrangement shown in FIG. 1 or FIG. 2, the high breakdown voltage of the bipolar transistor TR is implemented, and at the same time, for the same reason mentioned above, so that the reduction of the pinch-off voltage Vp is implemented, the impurity concentration in the channel portion is not lowered, and hence the improvement of the On resistance as well as the improvement of the Idss are implemented and the bipolar transistor TR which has stable and excellent characteristics is formed by a simple method without increasing the number of the manufacturing process as a semiconductor device having the junction-type field effect transistor J-FET and the bipolar transistor TR.

Then, when the arrangement shown in FIGS. 7 to 9 is presented, as there is provided the structure in which the collector of the bipolar transistor TR and the source of the junction-type field effect transistor J-FET are directly connected by the high concentration region 67, the reduction in collector resistance, the lowering of collector saturation voltage and further reduction in an element area can be realized.

Also, by providing an arrangement in which the collector of the bipolar transistor TR and the source of the junction-type field effect transistor J-FET are directly connected by the high concentration burying region 4 without having the high concentration region 67, reduction in the element area can be implemented.

Meanwhile, the device and its manufacturing method according to the present invention are not limited to the examples mentioned above. For example, as the bipolar transistor TR, there is provided a pnp-type transistor and as the junction-type field effect transistor, there is arranged a p-channel J-FET and further, it is possible to constitute the semiconductor device and the like in which a semiconductor element is commonly formed and so on.

As mentioned above, according to the device of the present invention and the manufacturing method of the present invention, in the semiconductor device comprising the bipolar transistor and the junction-type field effect transistor, in which the collector of the bipolar transistor and the source of the junction-type field effect transistor are connected to present high withstand voltage, as the arrangement surface at the edge portion on the drain side of the gate contact conductive layer in the junction-type field effect transistor is made to be a different surface from the arrangement surface at the edge portion on the gate side of the drain contact conductive layer, both the conductive layers can be arranged to be close enough or overlapping one another, while retaining both the conductive layer's areas in a necessary and sufficient state and further, because the gate portion and the contact portion of the drain electrode can resultantly be arranged adequately close, high density, reduction in the On resistance as well as improvement of Idss are implemented.

Also, the arrangement surface at the edge portion on the drain side of the gate contact conductive layer is made to be different from the arrangement surface at the edge portion on the gate side of the drain contact conductive layer as well as to be the arrangement surface below the latter, so the gate contact conductive layer can be extended over the drain region through the insulation layer, and as a result, the so-called MIS-FET structure is formed in the extended portion, the field effect of which implements reduction in the pinch-off voltage Vp. Therefore, as an enormous decrease in the impurity concentration in the channel portion can be avoided in order to reduce the pinch-off voltage Vp, such inconveniences that the On resistance increases and the Idss drops can be avoided, thereby making it possible to reduce the pinch-off voltage Vp and further, to implement the reduction in the on resistance, the improvement of the Idss and to manufacture the bipolar transistor which has stable and excellent characteristics.

Also, in order to manufacture this semiconductor device, according to the method of the present invention, an increase in the number of process is never brought about and hence, a drop in productivity and incurring of an increase in costs can be avoided.

Therefore, according to the present invention, a semiconductor device having high performance, high density, high integration and high reliability, in its turn, a large-integrated circuit having high performance, high density, high integration and high reliability can be realized.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A semiconductor device having a bipolar transistor and a junction-type field effect transistor, wherein a collector of said bipolar transistor and a source of said junction-type field effect transistor are connected, and said bipolar transistor and said junction-type field effect transistor are formed on a same substrate, said semiconductor device comprising:
   a source region having a source connecting region whose impurity density is greater than a channel portion;
   a gate region;
   a gate contact conductive layer being in contact with said gate region through an insulating layer;
   a drain region having a drain connecting region whose impurity density is greater than said channel portion; and
   a drain contact conductive layer being in contact with said drain connecting region through the insulating layer,
   wherein an upper surface of an edge portion on a drain side of said gate contact conductive layer is positioned below an upper surface of an edge portion on said gate side of said drain contact conductive layer,
   wherein a distance between said gate region and said drain connecting region is greater than a distance between said gate region and said source connecting region, and
   wherein said gate contact conductive layer extends to a direction of said drain connecting region.

2. A semiconductor device as claimed in claim 1, being characterized in that said drain contact conductive layer and said gate contact conductive layer are made of different kinds of materials.

3. A semiconductor device as claimed in claim 1, being characterized in that said drain contact conductive layer and said gate contact conductive layer are made of the same kind of material.

4. A semiconductor device as claimed in claim 1, being characterized in that a base contact conductive layer of said bipolar transistor and said gate contact conductive layer of said junction-type field effect transistor are formed of the same layer conductive layer.

5. A semiconductor device as claimed in claim 1, being characterized in that an emitter of said bipolar transistor and a gate of said junction-type field effect transistor are connected.

6. A semiconductor device as claimed in claim 1, a base of said bipolar transistor and a gate of said junction-type field effect transistor are connected.

7. A semiconductor device having a bipolar transistor and a junction-type field effect transistor, wherein a collector of said bipolar transistor and a source of said junction-type field effect transistor are connected, and said bipolar transistor and said junction-type field effect transistor are formed on a same substrate, said semiconductor device comprising:
   a source region having a source connecting region whose impurity density is greater than a channel portion;
   a gate region;
   a gate contact conductive layer being in contact with said gate region through an insulating layer;
   a drain region having a drain connecting region whose impurity density is greater than said channel portion; and
   a drain contact conductive layer being in contact with said drain connecting region through the insulating layer,
   wherein the collector of said bipolar transistor and the source connecting region of said junction-type field effect transistor are formed of a common semiconductor region,
   wherein an upper surface of an edge portion on a drain side of said gate contact conductive layer is positioned below an upper surface of an edge portion on said gate side of said drain contact conductive layer;
   wherein a distance between said gate region and said drain connecting region is greater than a distance between said gate region and said source connecting region, and
   wherein said gate contact conductive layer extends to a direction of said drain connecting region.

8. A semiconductor device as claimed in claim 7, being characterized in that said drain contact conductive layer and said gate contact conductive layer are made of different kinds of materials.

9. A semiconductor device as claimed in claim 7, being characterized in that said-drain contact conductive layer and said gate contact conductive layer are made of the same kind of material.

10. A semiconductor device as claimed in claim 7, being characterized in that a base contact conductive layer of said bipolar transistor and said gate contact conductive layer of said junction-type field effect transistor are formed of the same layer conductive layer.

11. A semiconductor device as claimed in claim 7, being characterized in that an emitter of said bipolar transistor and the gate of said junction-type field effect transistor are connected.

12. A semiconductor device as claimed in claim 7, being characterized in that a base of said bipolar transistor and a gate of said junction-type field effect transistor are connected.

13. A semiconductor device having a bipolar transistor and a junction-type field effect transistor, wherein a collector of said bipolar transistor and a source of said junction-type field effect transistor are connected, and said bipolar transistor and said junction-type field effect transistor are formed on a same substrate, said semiconductor device comprising:

a source region having a source connecting region whose impurity density is greater than a channel portion;

a gate region;

a drain region having a drain connecting region whose impurity density is greater than said channel portion;

a gate contact conductive layer being in contact with said gate region and is extended over said drain region through an insulating layer; and a drain contact conductive layer being in contact with said drain connecting region through the insulating layer, wherein an upper surface of an edge portion on a drain side of said gate contact conductive layer is positioned below an upper surface of an edge portion on said gate side of said drain contact conductive layer, and wherein a distance between said gate region and said drain connecting region is greater than a distance between said gate region and said source connecting region.

* * * * *